(12) United States Patent
Ji et al.

(10) Patent No.: US 8,940,186 B2
(45) Date of Patent: Jan. 27, 2015

(54) INSULATING LAYER COMPOSITION FOR SUBSTRATE, AND PREPREG AND SUBSTRATE USING THE SAME

(71) Applicant: Samsung Electro-Mechanics Co., Ltd., Suwon (KR)

(72) Inventors: Soo Young Ji, Suwon (KR); Suk Jin Ham, Suwon (KR); Seung Hwan Kim, Suwon (KR); Do Young Kim, Suwon (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 54 days.

(21) Appl. No.: 13/657,296

(22) Filed: Oct. 22, 2012

(65) Prior Publication Data

US 2013/0099149 A1    Apr. 25, 2013

(30) Foreign Application Priority Data

Oct. 25, 2011    (KR) .................. 10-2011-0109373

(51) Int. Cl.
| | | |
|---|---|---|
| *C09K 19/34* | (2006.01) |
| *C09K 19/06* | (2006.01) |
| *C08G 61/02* | (2006.01) |
| *C08J 3/00* | (2006.01) |
| *C09K 5/00* | (2006.01) |
| *C08K 5/15* | (2006.01) |
| *D21H 17/17* | (2006.01) |
| *C08K 5/1515* | (2006.01) |
| *H05K 1/03* | (2006.01) |
| *C08J 5/24* | (2006.01) |
| *C09K 19/38* | (2006.01) |
| *C09D 167/02* | (2006.01) |
| *C09D 177/00* | (2006.01) |
| *C09D 177/10* | (2006.01) |
| *C09D 179/08* | (2006.01) |
| *C08G 73/12* | (2006.01) |

(52) U.S. Cl.
CPC ................ *H05K 1/0353* (2013.01); *C08J 5/24* (2013.01); *C09K 19/3483* (2013.01); *C09K 19/3823* (2013.01); *C09D 167/02* (2013.01); *C09D 177/00* (2013.01); *C09D 177/10* (2013.01); *C09D 179/085* (2013.01); *C08G 73/123* (2013.01); *C08G 73/125* (2013.01); *C08G 73/126* (2013.01); *C08G 73/128* (2013.01); *C08J 2367/02* (2013.01); *H05K 1/0346* (2013.01); *H05K 1/0366* (2013.01); *H05K 2201/0141* (2013.01)
USPC ..................... 252/299.61; 252/62; 252/299.6; 523/1; 524/81; 524/107; 524/109

(58) Field of Classification Search
USPC ........... 252/62, 299.6, 299.61; 523/1; 524/81, 524/107, 109
See application file for complete search history.

(56) References Cited

U.S. PATENT DOCUMENTS 7,931,830 B2    4/2011  Japp et al.
2013/0099149 A1*  4/2013  Ji et al. ............................ 252/62

\* cited by examiner

*Primary Examiner* — Geraldina Visconti

(57) ABSTRACT

Disclosed herein are an insulating layer composition for a substrate, including a soluble type liquid crystal thermosetting oligomer, a metal alkoxide compound, and graphene oxide, and an insulating film and a substrate using the same. The insulating layer composition according to the present invention can effectively lower a coefficient of thermal expansion thereof, and thus, a dimensional change due to heat can be minimized when the insulating layer composition is used as an insulation material of the substrate, resulting in a substrate having improved thermal stability.

17 Claims, 5 Drawing Sheets
(2 of 5 Drawing Sheet(s) Filed in Color)

- PRIOR ART -

- PRIOR ART -

- PRIOR ART -

- PRIOR ART -

SURFACE FUNCTIONAL GROUP STRUCTURE

INSULATING LAYER COMPOSITION FOR SUBSTRATE, AND PREPREG AND SUBSTRATE USING THE SAME

CROSS REFERENCE(S) TO RELATED APPLICATIONS

This application claims the benefit under 35 U.S.C. Section 119 of Korean Patent Application Serial No. 10-2011-0109373, entitled "Insulating Layer Composition for Substrate, and Prepreg and Substrate using the same" filed on Oct. 25, 2011, which is hereby incorporated by reference in its entirety into this application.

BACKGROUND OF THE INVENTION

1. Technical Field

The present invention relates to an insulating layer composition for a substrate, and a prepreg and a substrate using the same.

2. Description of the Related Art

With the development of electronic devices, a printed circuit board has continuously been requested to have a low weight, a thin thickness, and a small size day by day. In order to satisfy these requests, wirings of the printed circuit board becomes more complex and further densified. Therefore, electric, thermal, and mechanical stabilities of the substrate act as more important factors. In particular, a coefficient of thermal expansion (CTE) is one of the important factors determining reliability at the time of manufacturing the printed circuit board.

The printed circuit board is made of mainly copper for circuit wirings and polymer for interlayer insulation. The polymer constituting an insulating layer has a very high coefficient of thermal expansion, as compared with copper. In order to overcome this difference, there are mainly used materials in which a coefficient of thermal expansion of the polymer constituting the insulating layer is lowered by impregnating the polymer with a woven glass fiber or adding an inorganic filler to the polymer.

In general, as the added amount of inorganic filler gets increased, the coefficient of thermal expansion of the insulating layer becomes further lowered, but a process for manufacturing the printed circuit board has limitations in lowering it unlimitedly.

In addition, in order to satisfy a request for high density of fine patterns, a surface roughness of the insulating layer also has been important. Therefore, the size of the added inorganic filler gets smaller and smaller in order to secure this surface roughness. However, the size of the inorganic filler gets smaller, which causes problems in uniform dispersibility. Therefore, uniform dispersion of nano-scaled inorganic filler becomes a big problem.

FIG. 1 shows a structure of a printed circuit board, which is made of copper serving as a circuit wiring and polymer serving as an inter insulating layer. The copper (Cu) circuit wiring has a coefficient of thermal expansion of 10~20 ppm/° C., and a normal polymer material used in the insulating layer has a coefficient of thermal expansion (CTE(a1)) of 50~80 ppm/° C. Since the coefficient of thermal expansion of the polymer is largely increased at a glass transition temperature (Tg, 150 to 200° C.) or higher, a coefficient of thermal expansion (a2) at a high temperature of the polymer reaches 150 to 180 ppm/° C.

In addition, at the time when parts such as semiconductor devices are mounted on the PCB, heat is rapidly supplied to the PCB at about 280° C. for 3 to 5 seconds. Here, in case where a difference in the coefficient of thermal expansion between a circuit and an insulating layer is large, cracks may occur in the circuit or a substrate may be distorted.

Ultimately, a polymer material for an insulating layer, which has the same coefficient of thermal expansion as copper for the circuit wiring and a semiconductor chip to be mounted on the substrate, is needed. However, for now, it is difficult to meet the requirements for complex and highly densifying wirings of printed circuits by using a material obtained by regulating the kind of polymer constituting the existing insulating layer and the content thereof, and a size and a content of inorganic filler.

Meanwhile, there exist two types in polymer composite insulation materials used in the insulating layer for a printed circuit board. One type is a prepreg made by impregnating woven glass fabric (or woven glass cloth) with a polymer composite insulation material, followed by B-staging at a temperature of a glass transition temperature (Tg) of the material or lower, as shown in FIG. 2.

The other type is a film produced by using only the polymer composite insulation material not containing woven glass cloth, as shown in FIG. 3. According to the latter, a polymer composite insulation material, an inorganic filler, a hardener, a solvent, an additive, a hardening promoter, and the like are blended at an optimum blending ratio, followed by mixing and dispersing, and then post-cased in a film type.

A polymer composite insulation material for forming an insulating layer of the existing printed circuit board is mainly an epoxy resin. A CTE of the epoxy resin itself is approximately 70 to 100 ppm/° C. The epoxy resin is impregnated with woven glass fiber, or a large amount of inorganic filler having a small CTE is added into an epoxy matrix as shown in FIG. 4, thereby realizing a low CTE of epoxy resin.

The CTE value is mostly decreased in a linear type according to the added amount of filler. However, if a large amount of filler is added in order to lower the CTE, dispersibility of the inorganic filler within the matrix is largely degraded, and thus, aggregation of the filler may occur and surface roughness of the printed circuit board may be largely increased. Further, as viscosity of epoxy is easily increased rapidly, molding of products is difficult. In particular, in a case of a multilayer structure in, for example, as insulating films used in the printed circuit board, interlayer binding may be often impossible.

Due to this limitation, effects of the filler need to be promoted by lowering the CTE of epoxy resin itself and introducing a critical amount of inorganic filler ensuring lamination processability. For example, in order to lower the CTE of the epoxy resin itself, mainly, epoxy resins having different structures are mixed and used, and here, components of the respective resins and compositions thereof perform important roles.

Further, the kind, size, and shape as well as the added amount of the inorganic filler affect the CTE of the epoxy resin, and thus, miniaturization of the added inorganic filler, that is, a nano-scaled inorganic filler is requested in order to realize ultrafine patterns. However, even though the nano-scaled inorganic filler is added, there are still difficulties in obtaining a homogenous molding film through uniform filler dispersion.

Therefore, the development of materials for the insulating layer of the printed circuit board having a low CTE is needed.

SUMMARY OF THE INVENTION

An object of the present invention is to provide an insulating layer composition for a substrate having a lower coefficient of thermal expansion than the existing insulating layer material, thereby solving the problem that thermal stability of the insulating layer material is deteriorated due to a high coefficient of thermal expansion thereof.

Another object of the present invention is to provide an insulating prepreg or an insulating film using the insulating layer composition.

Still another object of the present invention is to provide a substrate including the insulating prepreg or the insulating film.

According to an exemplary embodiment of the present invention, there is provided an insulating layer composition for a substrate, comprising a soluble type liquid crystal thermosetting oligomer, a metal alkoxide compound, and graphene oxide.

The soluble type liquid crystal thermosetting oligomer may be a compound expressed by Formula 1, Formula 1

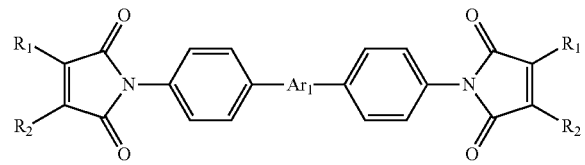

wherein, $R_1$ and $R_2$ each represent $CH_3$ or H, and at least one of $R_1$ and $R_2$ represents $CH_3$, $Ar_1$ represents a bivalent aromatic organic group having a molecular weight of 5,000 or less, which includes one or more structural units selected from the group consisting of ester, amide, ester amide, ester imide, and ether imide, $Ar_1$ includes one or more structural units selected from the group consisting of compounds expressed by Formula 2, Formula 2

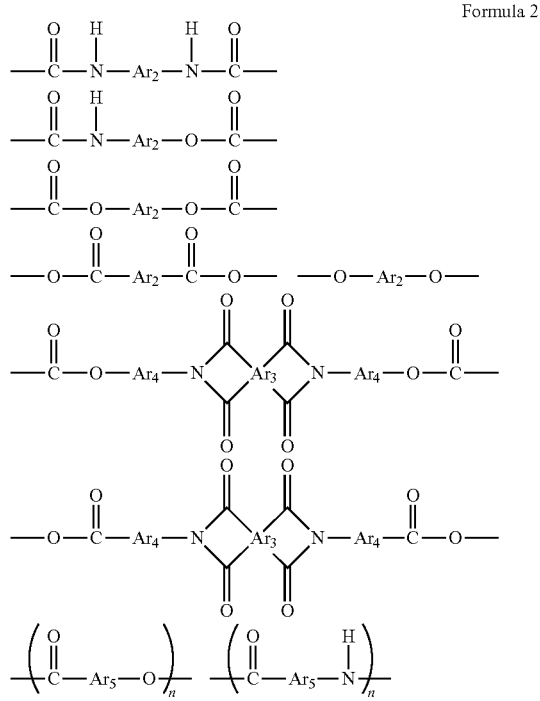

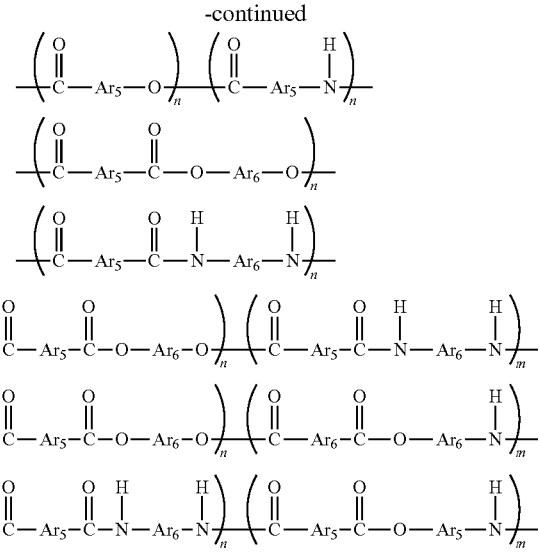

wherein, $Ar_2$, $Ar_4$, $Ar_5$ and $Ar_6$ each represent a bivalent aromatic organic group, which includes one or more structural units selected from the group consisting of compounds expressed by Formula 3, $Ar_3$ represents a tetravalent aromatic organic group, which includes one ore more structural units selected from the group consisting of compounds expressed by Formula 4, and n and m each represent an integer of 1 to 100.

Formula 3

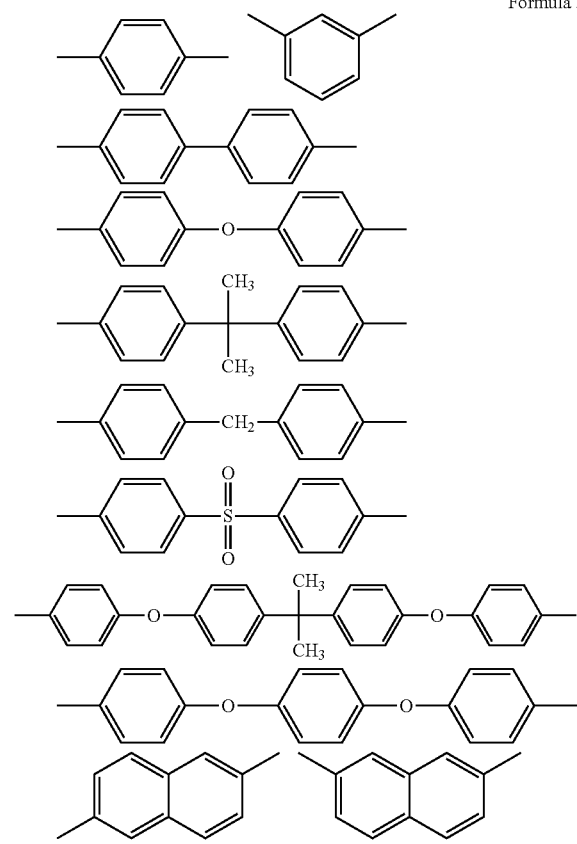

-continued

Formula 4

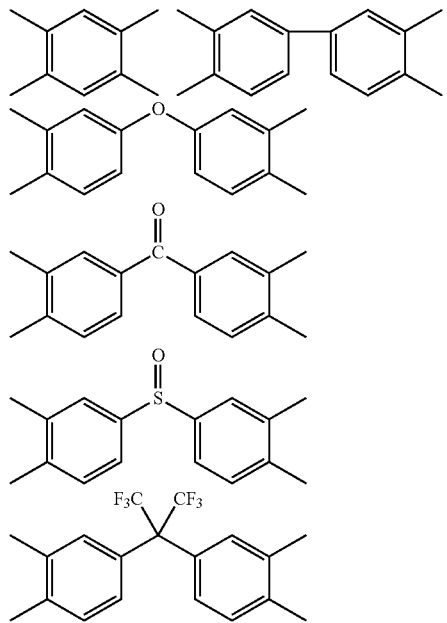

The soluble type liquid crystal thermosetting oligomer may have a number average molecular weight of 500 to 15,000.

The metal alkoxide compound may include a reactive group covalently bondable with a thermosetting group contained in the soluble type liquid crystal thermosetting oligomer.

The reactive group may be at least one selected from the group consisting of a vinyl group, an acryl group, a methacryl group, a mercapto group, and a combination thereof.

A metal of the metal alkoxide compound may be at least one selected from the group consisting of Ti, Al, Ge, Co, Ca, Hf, Fe, Ni, Nb, Mo, La, Re, Sc, Si, Ta, W, Y, Zr and V.

The graphene oxide may have at least one function group of a hydroxy group, a carboxyl group, and an epoxy group on a surface and an edge thereof.

The graphene oxide may have a ratio of carbon to oxygen (carbon/oxygen ratio) of 1 to 20.

The composition may include 0.01 to 50 parts by weight of the metal alkoxide compound based on the soluble type liquid crystal thermosetting oligomer, and 0.01 to 50 parts by weight of the graphene oxide based on a mixed weight of the soluble type liquid crystal thermosetting oligomer and the metal alkoxide compound.

The soluble type liquid crystal thermosetting oligomer may further include epoxy resin in a backbone thereof.

The epoxy resin may be contained in 0.01 to 50 parts by weight based on 100 parts by weight of the soluble type liquid crystal thermosetting oligomer.

The soluble type liquid crystal thermosetting oligomer, metal alkoxide compound, and graphene oxide may form covalent bonds with each other by a hardening reaction, to provide an organic/inorganic hybrid structure.

The covalent bonds may be formed between the soluble type liquid crystal thermosetting oligomer and the graphene oxide, between the epoxy resin and the graphene oxide, between the metal alkoxide compound and the graphene oxide, and between the graphene oxide and the graphene oxide.

The metal alkoxide compound and the graphene oxide may be separately added into the insulating layer composition, or the metal alkoxide compound and the graphene oxide may be added as a composite nano inorganic filler produced by a condensation reaction.

According to another exemplary embodiment of the present invention, there is provided an insulating prepreg or an insulating film using the insulating layer composition for a substrate.

According to still another exemplary embodiment of the present invention, there is provided a substrate including the insulating prepreg or the insulating film.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

DESCRIPTION OF THE PREFERRED EMBODIMENTS

Figure 1:
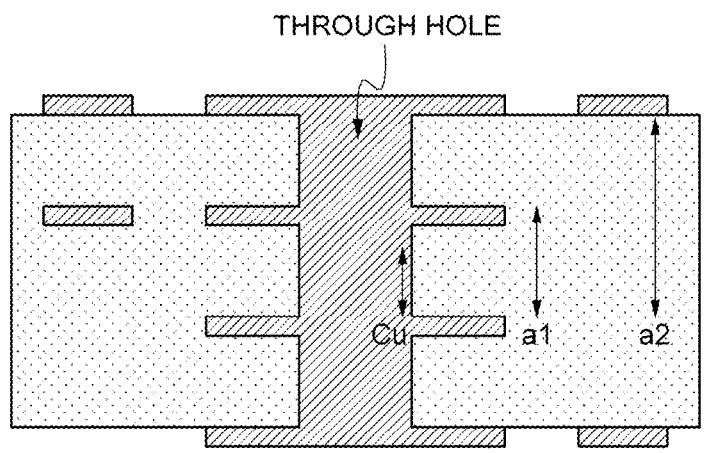
FIG. 1 shows a part of a structure of a normal printed circuit board.
Figure 2:
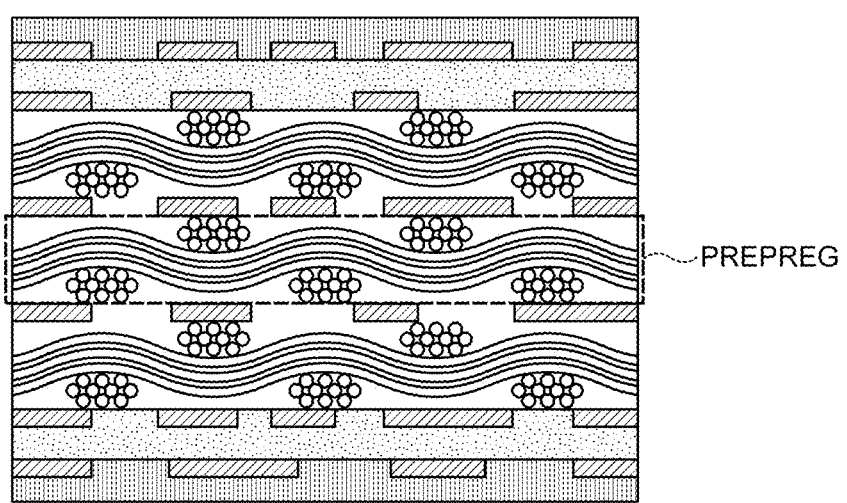
FIG. 2 shows a prepreg type insulating layer for a printed circuit board.
Figure 3:
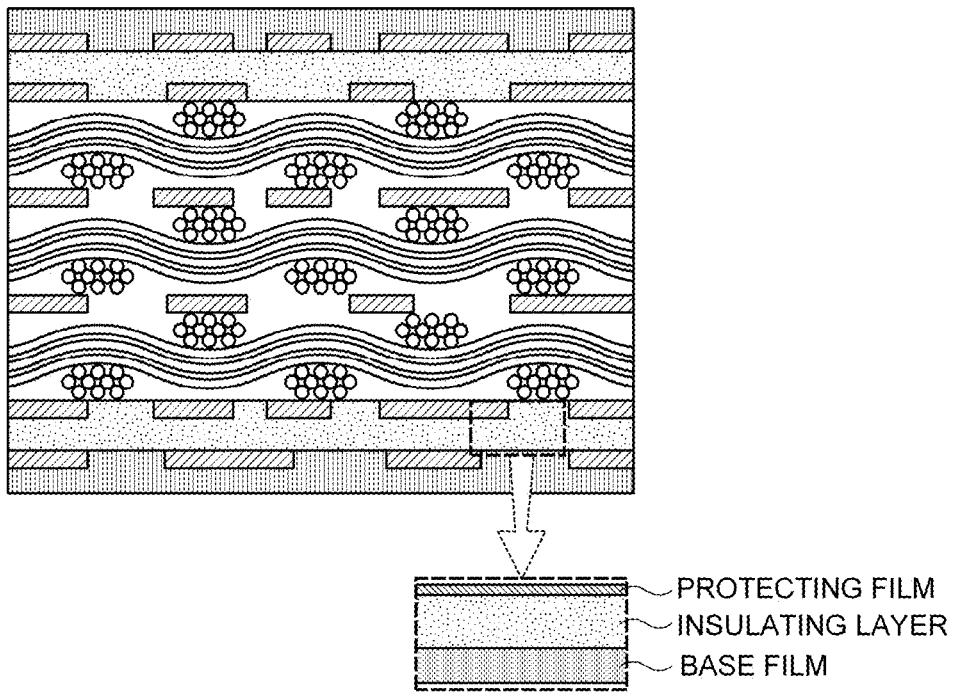
FIG. 3 shows a film type insulating layer for a printed circuit board.
Figure 4:
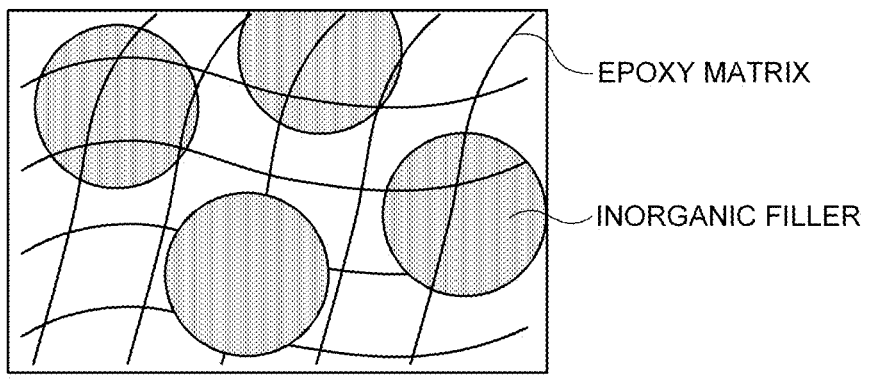
FIG. 4 is a conceptual view of an inorganic filler-added epoxy matrix according to the related art.

Hereinafter, preferred embodiments of the present invention will be described in detail with reference to the accompanying drawings.

Terms used in the present specification are for explaining the embodiments rather than limiting the present invention. Unless explicitly described to the contrary, a singular form includes a plural form in the present specification. Also, used herein, the word "comprise" and/or "comprising" will be understood to imply the inclusion of stated constituents, steps, numerals, operations and/or elements but not the exclusion of any other constituents, steps, operations and/or elements.

The present invention is directed to an insulating layer composition for a printed circuit board, which has high rigidity and a low coefficient of thermal expansion by hardening graphene oxide and metal alkoxide together with a soluble type liquid crystal thermosetting oligomer and a polymer.

A soluble type liquid crystal thermosetting oligomer having excellent thermal (CTE), electric, and mechanical stabilities, or a soluble type liquid crystal thermosetting oligomer containing a small amount of epoxy in the backbone thereof is used as a polymer according to the present invention.

This soluble type liquid crystal thermosetting oligomer of the present invention may be expressed by Formula 1.

Formula 1

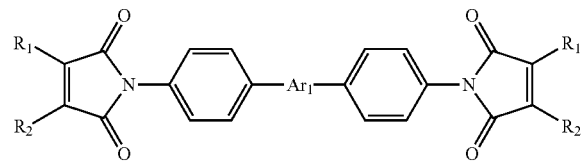

wherein, $R_1$ and $R_2$ each represent $CH_3$ or H, and at least one of $R_1$ and $R_2$ represents $CH_3$, $Ar_1$ represents a bivalent aromatic organic group having a molecular weight of 5,000 or less, which includes one or more structural units selected from the group consisting of ester, amide, ester amide, ester imide, and ether imide.

$Ar_1$ includes one or more structural units selected from the group consisting of compounds expressed by Formula 2, Formula 2

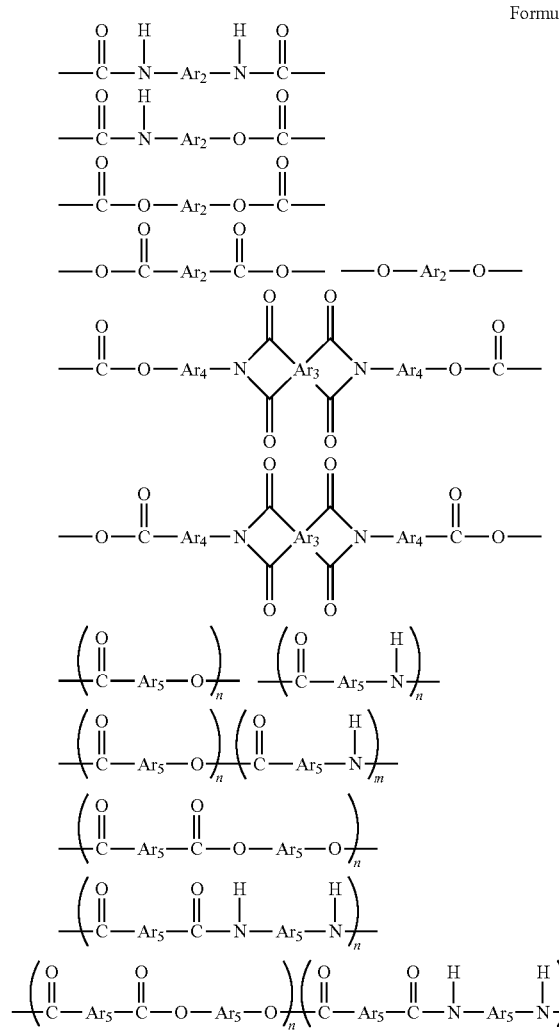

wherein, $Ar_2$, $Ar_4$, $Ar_5$ and $Ar_6$ each represent a bivalent aromatic organic group, which includes one or more structural units selected from the group consisting of compounds expressed by Formula 3, $Ar_3$ represents a tetravalent aromatic organic group, which includes one or more structural units selected from the group consisting of compounds expressed by Formula 4, n and m each represent an integer of 1 to 100.

Formula 3

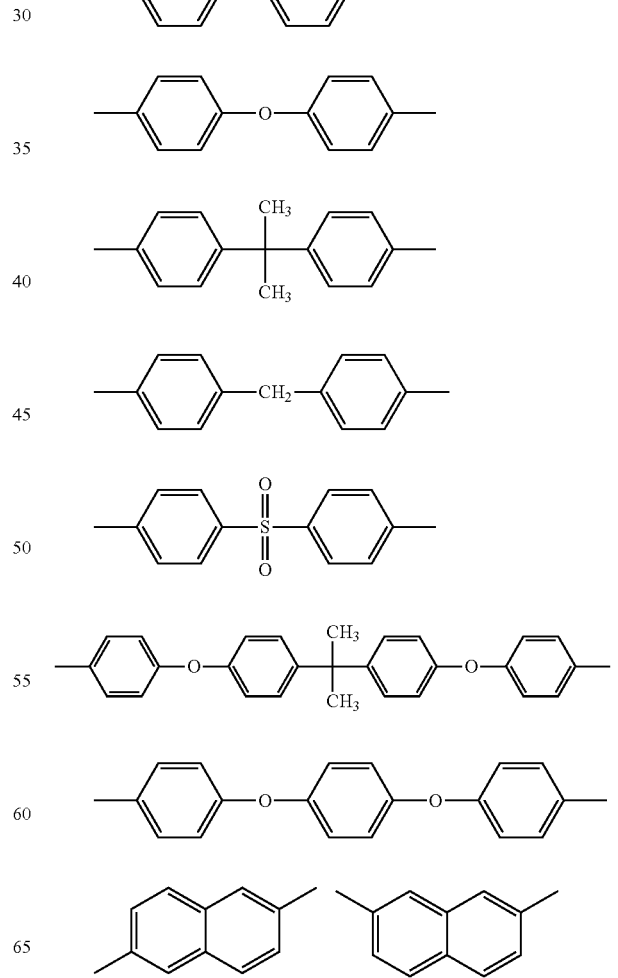

-continued

Formula 4

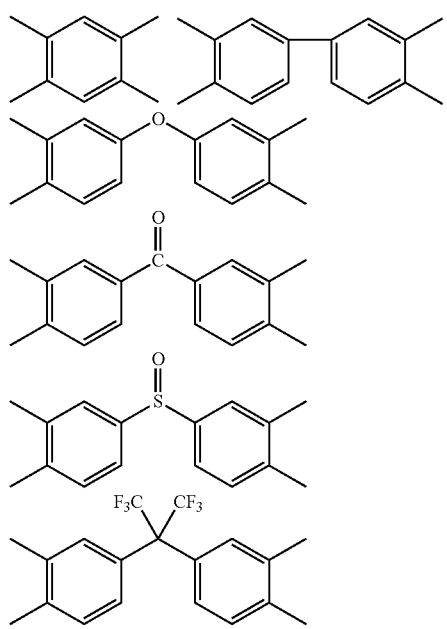

Preferably, the solubility liquid crystal thermosetting oligomer expressed by Formula 1 has a number average molecular weight of 500 to 15,000. If the molecular weight of the soluble type liquid crystal thermosetting oligomer is below 500, a cross-linking density gets higher, and thus physical properties thereof may become brittle. If the molecular weight thereof is above 15,000, viscosity of the solution gets higher, and this may be disadvantageous at the time of impregnating with woven glass fiber.

In addition, as the polymer resin according to the present invention, the soluble type liquid crystal thermosetting oligomer containing an epoxy resin in the backbone thereof may be used.

Here, the epoxy resin may be contained in 0.01 to 50 parts by weight based on 100 parts by weight of the soluble type liquid crystal thermosetting oligomer. In addition, examples of the epoxy resin may include, but are not particularly limited to, for example, bisphenol A epoxy resin, naphthalene modified epoxy resin, cresol novolac epoxy resin, rubber modified epoxy resin, and the like. They may be used alone or a mixture of two or more, but not particularly limited thereto.

One example of the soluble type liquid crystal thermosetting oligomer according to the present invention is expressed by Formula 5.

Formula 5

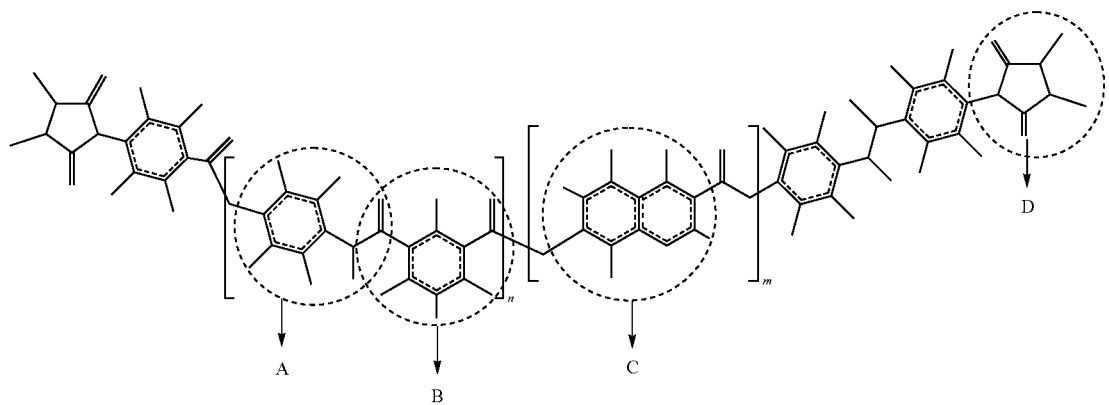

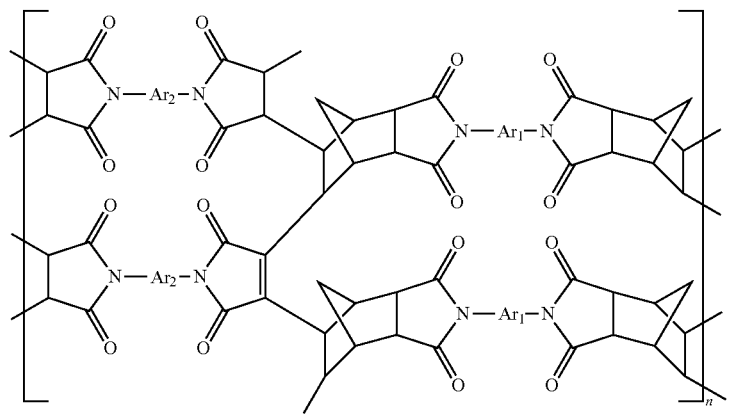

As shown in Formula 5 above, the soluble type liquid crystal thermosetting oligomer according to the present invention includes a soluble structure (A) which is soluble in one or more solvents, and a group (B) having excellent processability in a backbone thereof, so that it is soluble in a general solvent. The soluble type liquid crystal thermosetting oligomer according to the present invention also has a functional group (C) capable of realizing liquid crystal characteristics, and has functional groups (D) at both ends thereof, which are thermally settable.

A method for preparing the soluble type liquid crystal thermosetting oligomer according to the present invention is not particularly limited, and may be prepared by reacting compounds capable of preparing a liquid crystal oligomer including soluble structural units by polymerization and compounds capable of introducing a thermosetting group.

The compounds capable of preparing a liquid crystal oligomer including soluble structural units are not particularly limited. For example, they may be selected from the group consisting of one or more aromatic, aromatic heterocyclic, or aliphatic dicarboxylic acids; aromatic, aromatic heterocyclic, or aliphatic diols; aromatic, aromatic heterocyclic, or aliphatic diamines; amino phenols; hydroxy benzoic acids; and aminobenzoic acids, and preferably, one or more of aromatic, aromatic heterocyclic, or aliphatic diols; amino phenols; and aminobenzoic acids may be used.

For example, the liquid crystal thermosetting oligomer may be prepared by solution polymerization or bulk polymerization. The solution polymerization and the bulk polymerization may be performed within one reactor tank with appropriate stirring members.

The soluble type liquid crystal thermosetting oligomer having the above structure has a much lower coefficient of thermal expansion than the epoxy resin used as the existing insulating polymer and includes various functional groups, and thus, is advantageous in forming a hybrid composite structure together with other components contained in the insulating layer composition.

According to the present invention, in order to lower the coefficient of thermal expansion of the insulating layer composition, an inorganic filler using graphene oxide and metal alkoxide may be used together with the soluble type liquid crystal thermosetting oligomer. The graphene oxide and metal alkoxide used as the additives all have a functional group covalently bondable with a soluble type liquid crystal thermosetting oligomer, and thus they may become a hybrid type insulating material.

Examples of the metal alkoxide compounds having a covalently bondable reactive group may include compounds expressed by Formulas 6 to 9 below, but are not particularly limited thereto.

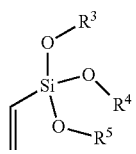

Formula 6 wherein, $R^3$ to $R^5$ each independently may represent an alkyl group having at least one carbon atom, which may be for example a methane group, an ethane group, a propane group, or the like.

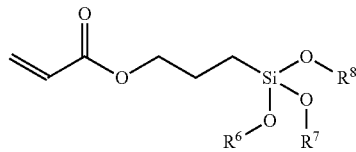

Formula 7 wherein, $R^6$ to $R^8$ each independently may represent an alkyl group having at least one carbon atom, which may be for example a methane group, an ethane group, a propane group, or the like.

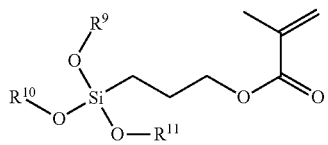

Formula 8 wherein, $R^9$ to $R^{11}$ each independently may represent an alkyl group having at least one carbon atom, which may be for example a methane group, an ethane group, a propane group, or the like.

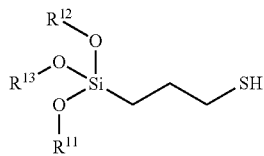

Formula 9 wherein, $R^{12}$ ~$R^{14}$ each independently may represent an alkyl group having at least one carbon atom, which may be for example a methane group, an ethane group, a propane group, or the like.

The metal alkoxide compound of the present invention preferably includes a reactive group covalently bondable with a thermosetting group contained in the soluble type liquid crystal thermosetting oligomer. In addition, each metal compound having a single reactive group may be used alone, or a combination of respective metal compounds having several reactive groups may be used.

The reactive group may be at least one selected from the group consisting of a vinyl group, an acryl group, a methacryl group, a mercapto group, and a combination thereof. Further, a metal of the metal alkoxide compound may be at least one selected from the group consisting of Ti, Al, Ge, Co, Ca, Hf, Fe, Ni, Nb, Mo, La, Re, Sc, Si, Ta, W, Y, Zr and V.

This metal alkoxide compound is preferably contained in 0.01 to 50 parts by weight based on the weight of the soluble type liquid crystal thermosetting oligomer. If the content of the metal alkoxide compound is below 0.01 parts by weight, an effect of decreasing the coefficient of thermal expansion is slight. If the content thereof is above 50 parts by weight, the insulating layer may be brittle, resulting in cracks.

Figure 5:
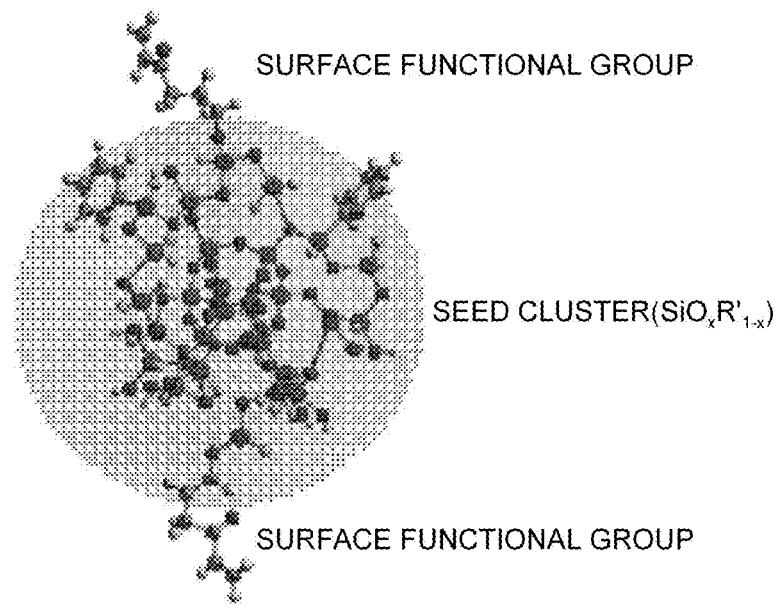
FIG. 5 shows a structure of a metal alkoxide compound having groups for covalent bonding.

The structure of the metal alkoxide compound according to the present invention is shown in FIG. 5, and it consists of a seed cluster (a portion inside the circle) generated from metal alkoxide and surface functional groups (a portion outside the circle) each capable of forming a covalent bond with the thermosetting group of the soluble type liquid crystal thermosetting group.

Also, unlike FIG. 5, a heterogeneous film may be formed by forming only seed clusters without surface functional groups and then dispersing them in the soluble type liquid crystal thermosetting oligomer.

Therefore, the metal alkoxide compound is used to form nano-scale inorganic clusters in a soluble type liquid crystal thermosetting oligomer in situ, and covalent bonds between the generated cluster and the groups existing at both ends of the soluble type liquid crystal thermosetting oligomer are formed.

Figure 8:
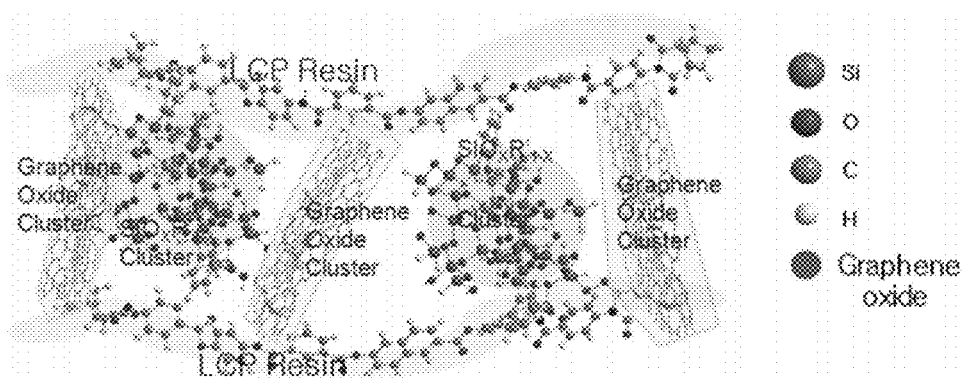
FIG. 8 is a conceptual view of an organic/inorganic hybrid structure composed of graphene oxide, a metal alkoxide compound, and a soluble type liquid crystal thermosetting oligomer, according to an exemplary embodiment of the present invention.

In other words, at the time of a hardening reaction of the soluble type liquid crystal thermosetting liquid crystal, which is a main matrix, the reactive groups strongly covalently bonded to the generated cluster directly participates in the reaction, thereby forming strong covalent bonds between the soluble type liquid crystal thermosetting oligomer matrix and the inorganic cluster (see, FIG. 8). This strong covalent bond with the inorganic cluster causes mobility of a polymer chain, which is a main cause of thermal expansion, to be extremely lowered.

In addition, the graphene oxide is added into the insulating layer composition of the present invention, together with the metal alkoxide compound. The graphene oxide has a low coefficient of thermal expansion and excellent mechanical properties. Therefore, properties of the polymer resin can be improved even through addition of a small amount thereof, as compared with an inorganic filler such as silica or the like, which is generally added in order to improve mechanical rigidity of the polymer resin.

The graphene oxide may be prepared by oxidizing graphite, and the graphite has a layered structure in which plate graphene structures each composed of carbon atoms linked in hexagonal shapes are laminated. Since a distance between layers is 3.35 and carbon nanotubes are stretched out in a plate type, the graphite has high electric conductivity corresponding to that of carbon nanotubes and has excellent mechanical properties.

If graphite powder is oxidized, respective layers of the graphite is oxidized while the layered structure thereof is maintained, thereby obtaining graphene oxide powder onto which a hydroxy group, a carboxyl group, an epoxy group, or the like is attached. The graphene oxide powder may be prepared by oxidizing the graphite powder with using an oxidizing agent or through an electrochemical method. Examples of the oxidizing agent may include, but not limited to, for example, nitric acid, $NaClO_3$, $KMnO_4$, or the like, and they may be used alone or a mixture of two or more thereof.

Preferably, as the graphene oxide according to the present invention, sufficiently oxidized graphene oxide is used in order to prevent insulating properties of the polymer resin from being deteriorated. In other words, it is preferable to use graphene oxide of which electric conductivity is little exhibited or completely lost due to sufficient oxidization thereof. For achieving this, a ratio of carbon to oxygen (carbon/oxygen) in graphene oxide may be changed depending on the degree of oxidation, and is preferably, for example, 1 to 20.

Figure 6:
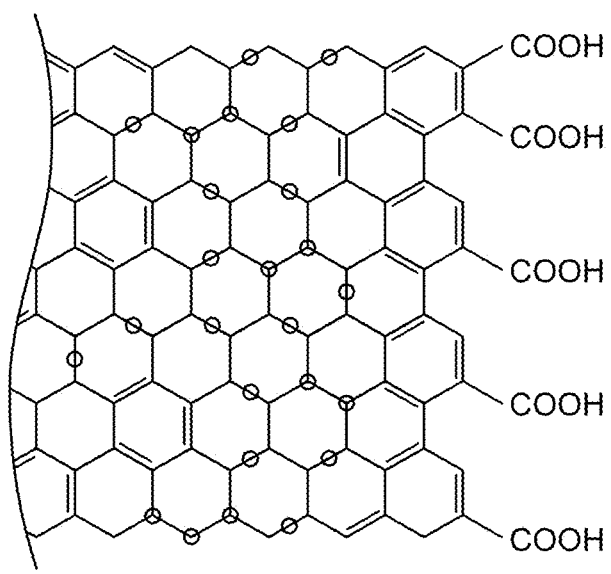
FIG. 6 shows a structure of graphene oxide.
Figure 7:
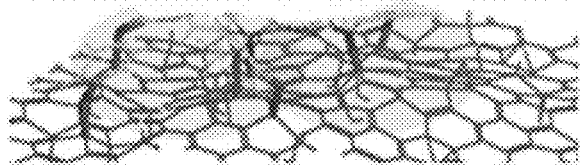
FIG. 7 is a conceptual view of a graphene oxide cluster having groups for covalent bonding.

FIGS. 6 and 7 each schematically show a part of the graphene oxide according to the present invention. A plurality of epoxy groups and carboxyl groups are included on a surface and edges thereof. The kind and number of functional groups may be changed depending on the oxidizing method or oxidizing degree of graphene oxide.

Therefore, if the graphene oxide is added into the insulating layer composition of the present invention, it may be physically dispersed in a cured product of the soluble type liquid crystal thermosetting oligomer resin, and form chemical bonds with the polymer resin by the functional groups.

The graphene oxide having the functional groups may form covalent bonds with the soluble type liquid crystal thermosetting oligomer resin by a hardening reaction, and thus, there may be formed a composite in which the graphene oxide is organically linked with the soluble type liquid crystal thermosetting oligomer resin.

Similar to the metal alkoxide cluster, the graphene oxide also is mixed with and dispersed in a main material or a main material containing additives while omitting a covalent bonding procedure, thereby forming a heterogeneous film.

The graphene oxide is preferably contained in 0.01 to 50 parts by weight based on a weight of a mixture of the soluble type liquid crystal thermosetting oligomer and the metal alkoxide compound. If the content of the graphene oxide is below 0.01 parts by weight, an effect of decreasing the coefficient of thermal expansion is slight. If the content thereof is above 50 parts by weight, viscosity of a solution gets lowered, resulting in an extremely thin thickness of a film.

In addition, the graphene oxide having an insulating property is further added, thereby increasing the critical added amount of an inorganic filler additive. The reason is that the graphene oxide has a wider particle size distribution than the inorganic filler additive used in the related art, that is, from nanometers (nm) to microns (μm). In the related art, the inorganic filler of alkoxide needs to be formed to have a nanometer size in the liquid crystal thermosetting oligomer. However, in the present invention, the graphene oxide having a size from nanometers (nm) to microns (μm) is added to generate more pores among the main material and the metal alkoxide as compared with the related art, thereby increasing the critical added amount of the inorganic filler.

As a result, the soluble type liquid crystal thermosetting oligomer, the metal alkoxide compound, and the graphene oxide contained in the insulating layer composition of the present invention may form covalent bonds therebetween by the hardening reaction, resulting in a hybrid structure.

The organic-inorganic insulating material for a printed circuit board of the present invention is a homogeneous organic-inorganic composite material in which metal clusters, which are generated by a condensation reaction between graphene oxide (Graphene Oxide Cluster) and metal alkoxide compound ($SiO_xR'_{1-x}$ Cluster), form covalent bonds with an LCT matrix (Formula 1, LCP Resin), as confirmed in FIG. 8.

The covalent bonds may be formed between the soluble type liquid crystal thermosetting oligomer and the graphene oxide, between the epoxy resin and the graphene oxide, between the metal alkoxide compound and the graphene oxide, and between the graphene oxide and the graphene oxide.

Further, in addition to the covalent bonds, hardening of the soluble type liquid crystal thermosetting oligomer and hardening of the epoxy resin also may be conducted. As such, it can be seen that respective the insulating layer composition according to the present invention has a network structure in which respective components are organically linked.

According to an exemplary embodiment of the present invention, the metal alkoxide compound and the graphene oxide may be separately added into the insulating layer composition, or may be added as a composite nano inorganic filler produced by the condensation reaction.

A solvent used at the time of preparing the insulating layer composition according to the present invention is not particularly limited, but a polar aprotic solvent may be used. For example, the solvent may be selected from the group consisting of N, N-dimethylacetamide, N-methyl pyrrolidone (NMP), N-methyl caprolactone, N, N-dimethyl formamide, N, N-diethyl formamide, N, N-diethyl acetamide, N-methyl propionamide, dimethyl sulfoxide, γ-butyl lactone, dimethyl imidazolidinone, tetramethyl phosphoric amid, and ethyl cellosolve acetate, and optionally, a mixed solvent of two or more thereof may be used.

The insulating layer composition of the present invention may further include one or more additives selected from a filler, a softener, a plasticizer, a lubricant, a anti-static agent, a colorant, an antioxidant, a heat stabilizer, a light stabilizers, and a UV absorber, as necessary. Examples of the filler may include organic fillers such as epoxy resin powder, melamine resin powder, urea resin powder, benzoguanamine resin powder, and styrene resin powder; and inorganic fillers such as silica, alumina, titanium oxide, zirconia, kaolin, calcium carbonate, and calcium phosphate.

Further, the present invention may provide a substrate including the insulating layer composition as an insulating material. The insulating layer composition according to the present invention, which is a organic-inorganic hybrid structure composite material, has excellent thermal, mechanical, and electric properties, and thus applicability thereof to the substrate is high.

In addition, the insulating material is in a prepreg type where the insulating layer composition is impregnated with woven glass fiber. Alternatively, the insulating layer material is processed into a buildup film itself, which is used as the insulating material.

Figure 9:
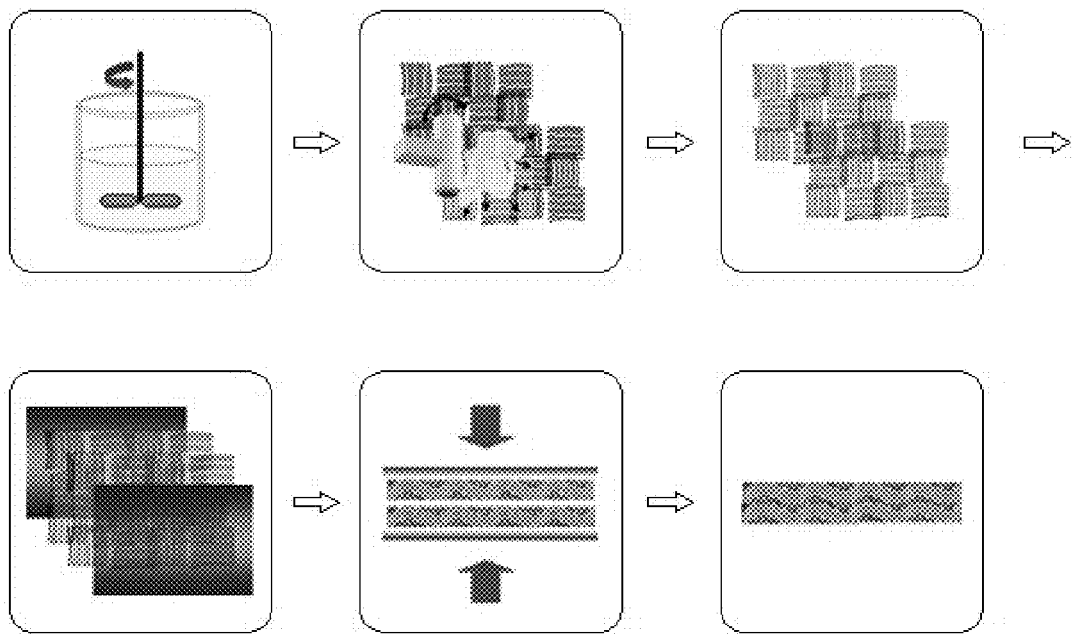
FIG. 9 is a conceptual view showing a process of impregnating an insulating layer composition according to an exemplary embodiment of the present invention.

FIG. 9 is a conceptual view showing a process of impregnating an insulating layer composition according to the present invention. Referring to this, first, a soluble type liquid crystal thermosetting oligomer resin, graphene oxide, and a metal alkoxide compound are mixed to prepare an insulating layer composition.

Then, this is impregnated with an appropriate reinforcing agent to prepare a prepreg. The reinforcing agent used herein is not particularly limited, but examples thereof may include woven glass cloth, woven alumina glass cloth, nonwoven glass cloth, nonwoven cellulose, woven carbon cloth, polymer cloth, and the like. In addition, as the method for impregnating the insulating composition for a substrate with the reinforcing agent, dip coating, roll coating, and the like may be employed, or any other normal impregnating method may be employed.

Then, the prepreg is dried at an appropriate temperature for an appropriate time, and laid-up with a copper foil or the like, followed by hardening, and thus, a sheet type product may be manufactured.

Further, the insulating layer composition according to the present invention has high adhesive strength with a copper foil, excellent heat resistance, low expansibility, and excellent mechanical properties, and thus, it can be used as a superior packaging material. The insulating layer composition may be molded on the substrate, may be impregnated, or may be used to form varnish for coating. The composition may be applied to a printed circuit board, respective layers of a multilayer substrate, a copper-clad laminate (for example, RCC, CCL), or a film for TAB, but the usage of the insulating layer composition is not limited thereto.

Example 1

Following FIG. 9, 100 g of soluble type liquid crystal thermosetting oligomer (a number average molecular weight of 7500 to 9000) having a structure of Formula 5 and 25 g of N-methyl-2-pyrolidone (NMP) were put into a 100 ml flask with a condenser and a stirrer, and then stirred while the temperature was gently raised up to 90° C., resulting in dissolving the soluble type liquid crystal thermosetting oligomer. Here, the soluble type liquid crystal thermosetting oligomer prepared by mixing aminophenol, isophthalic acid, naphthoic acid, hydroxybenzoic acid, nadimido benzoic acid at a molecular mole ratio of 2.1:2:2:2, followed by reaction, was used.

Then, 30 parts by weight of a mixture obtained by mixing trimethoxyvinyl silane and tetraethyl orthosilicate at a molecular mole ratio of 1:5, as a metal alkoxide compound, was added thereto, based on the soluble type liquid crystal thermosetting oligomer.

In addition, 2 parts by weight of graphene oxide (carbon/oxygen ratio=11 to 20) based on the soluble type liquid crystal thermosetting oligomer and the metal alkoxide compound was added thereto, followed by stirring, thereby preparing an insulating layer composition.

The insulating layer composition was impregnated with woven glass fiber (1080 glass fiber) to prepare a prepreg.

Reference Example

A prepreg (DOOSAN Electronics, 1080 glass fiber) accessible on the market was used as Reference Example.

Comparative Example 1

Only the soluble type liquid crystal thermosetting oligomer of Example 1 was impregnated with woven glass fiber to prepare a prepreg, which was then used as Comparative Example 1.

Comparative Example 2

The insulating layer composition made of only the soluble type liquid crystal thermosetting oligomer and the metal alkoxide compound in Example 1 was impregnated with woven glass fiber to prepare a prepreg, which was then used as Example 2.

Experimental Example 1

The prepreg prepared in each of Example 1, Reference Example, Comparative Examples 1 and 2 was compressed to obtain a film type product, and then thermal characteristics and a coefficient of thermal expansion (CTE) thereof were measured by using TMA Q400 from TA Company. The results are shown in Table 1 and FIG. 10. The measurement was conducted at a temperature rise rate of 10° C./min while nitrogen was purged. The low-temperature coefficient of thermal expansion was obtained by an average value of a section of 50 to 100° C.

TABLE 1

| | Unit: μm/° C. (ppm/° C.) | | | |
| --- | --- | --- | --- | --- |
| | Reference Example | Comparative Example 1 | Comparative Example 2 | Example 1 |
| Low-temperature coefficient of thermal expansion a1(50~100° C.) | 15 | 10.3 | 8.4 | 7.3 |

The results of Table 1 showed that the coefficient of thermal expansion is somewhat lowered when only the soluble type liquid crystal thermosetting oligomer was included (Comparative Example 1) and when the soluble type liquid crystal thermosetting oligomer and the metal alkoxide compound were included (Comparative Example 2) as compared with a coefficient of thermal expansion of the material on the market (Reference Example), 15 μm/° C., but effective improvement in the coefficient of thermal expansion was still insufficient.

However, it can be confirmed that the coefficient of thermal expansion of Example 1 of the present invention, which includes all the soluble type liquid crystal thermosetting oligomer, metal alkoxide compound, and graphene oxide, can be further lowered by ½ times than the material on the market.

Figure 10:
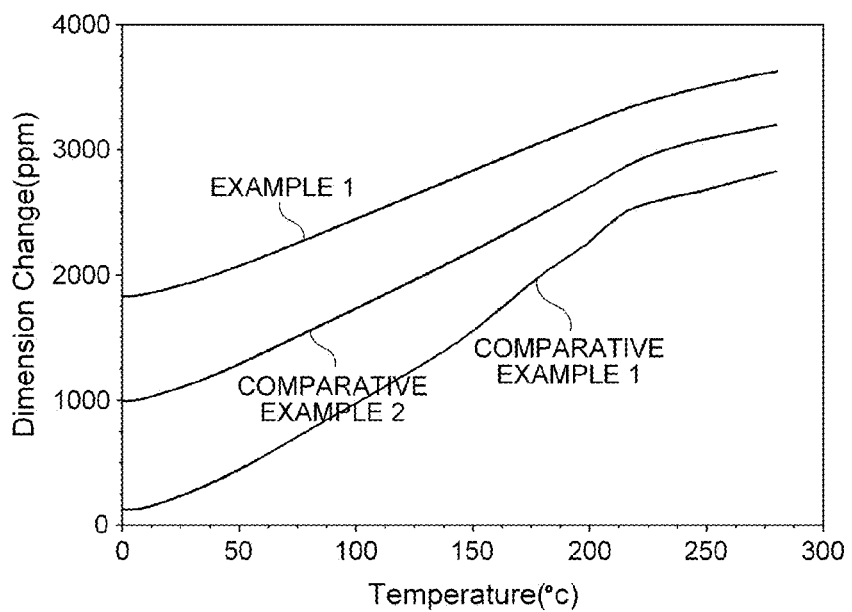
FIG. 10 shows TMA results of insulating materials according to Comparative Examples 2 and 3 and Example 1.

Further, as can be confirmed from TMA results of FIG. 10, Example 1 of the present invention was much more superior to Comparative Examples 1 and 2 in view of thermal stability of the insulating material.

Therefore, according to the insulating layer composition of the present invention, a soluble type liquid crystal thermosetting oligomer, an insulation type graphene oxide, and a metal alkoxide compound were included and the respective components participate in a hardening reaction or a covalent bonding reaction with each other, thereby forming an organic/inorganic hybrid structure composite material in which the graphene oxide, polymer resin, and metal alkoxide are organically linked, and this structure can effectively lower the coefficient of thermal expansion.

As set forth above, the present invention does not employ an epoxy resin generally used, but a soluble type liquid crystal thermosetting oligomer having a much lower CTE than the epoxy resin or a soluble type liquid crystal thermosetting oligomer containing a small amount of epoxy in the backbone thereof, as the main matrix, and the present invention further includes the insulation type of graphene oxide and metal alkoxide compound in order to further lower the CTE thereof. Therefore, if an epoxy polymer and a hardening agent are added to the composition, following by a hardening reaction, hardening of the soluble type liquid crystal thermosetting oligomer occurs, and also, a hardening reaction or a covalent bonding reaction occurs between the soluble type liquid crystal thermosetting oligomer and the graphene oxide, between the epoxy resin and the graphene oxide, between the metal alkoxide compound and the graphene oxide, and between the graphene oxide and the graphene oxide, thereby forming a hybrid structure composite material in which graphene oxide, polymer resin, and metal alkoxy are organically linked.

Therefore, the composite material having a low coefficient of thermal expansion is used as an insulating material of a substrate, resulting in minimizing a dimensional change, thereby manufacturing a substrate having improved thermal stability.

While the present invention has been shown and described in connection with the embodiments, it will be apparent to those skilled in the art that modifications and variations can be made without departing from the spirit and scope of the invention as defined by the appended claims.

What is claimed is:

1. An insulating layer composition for a substrate, comprising a soluble liquid crystal thermosetting oligomer, a metal alkoxide compound, and graphene oxide.

2. The insulating layer composition for a substrate according to claim 1, wherein the soluble liquid crystal thermosetting oligomer is a compound expressed by Formula 1,

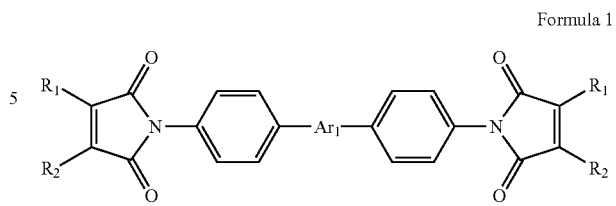

Formula 1 wherein, $R_1$ and $R_2$ each represent $CH_3$ or H, and at least one of $R_1$ and $R_2$ represents $CH_3$, $Ar_1$ represents a bivalent aromatic organic group having a molecular weight of 5,000 or less, which includes one or more structural units selected from the group consisting of ester, amide, ester amide, ester imide, and ether imide.

3. The insulating layer composition for a substrate according to claim 1, wherein the soluble liquid crystal thermosetting oligomer has a number average molecular weight of 500 to 15,000.

4. The insulating layer composition for a substrate according to claim 1, wherein the metal alkoxide compound includes a reactive group covalently bondable with a thermosetting group contained in the soluble liquid crystal thermosetting oligomer.

5. The insulating layer composition for a substrate according to claim 4, wherein the reactive group is at least one selected from the group consisting of a vinyl group, an acryl group, a methacryl group, a mercapto group, and a combination thereof.

6. The insulating layer composition for a substrate according to claim 4, wherein a metal of the metal alkoxide compound is at least one selected from the group consisting of Ti, Al, Ge, Co, Ca, Hf, Fe, Ni, Nb, Mo, La, Re, Sc, Si, Ta, W, Y, Zr and V.

7. The insulating layer composition for a substrate according to claim 1, wherein the graphene oxide has at least one functional group of a hydroxy group, a carboxyl group, and an epoxy group on a surface and an edge thereof.

8. The insulating layer composition for a substrate according to claim 1, wherein the graphene oxide has a ratio of carbon to oxygen (carbon/oxygen ratio) of 1 to 20.

9. The insulating layer composition for a substrate according to claim 1, wherein the composition includes 0.01 to 50 parts by weight of the metal alkoxide compound based on the soluble liquid crystal thermosetting oligomer, and 0.01 to 50 parts by weight of the graphene oxide based on a mixed weight of the soluble liquid crystal thermosetting oligomer and the metal alkoxide compound.

10. The insulating layer composition for a substrate according to claim 1, wherein the soluble liquid crystal thermosetting oligomer further includes epoxy resin in a backbone thereof.

11. The insulating layer composition for a substrate according to claim 10, wherein the epoxy resin is contained in 0.01 to 50 parts by weight based on 100 parts by weight of the soluble liquid crystal thermosetting oligomer.

12. The insulating layer composition for a substrate according to claim 1, wherein the soluble liquid crystal thermosetting oligomer, metal alkoxide compound, and graphene oxide form covalent bonds with each other by a hardening reaction, to provide an organic/inorganic hybrid structure.

13. The insulating layer composition for a substrate according to claim 12, wherein the covalent bonds are formed between the soluble liquid crystal thermosetting oligomer and the graphene oxide, between the epoxy resin and the graphene oxide, between the metal alkoxide compound and the graphene oxide, and between the graphene oxide and the graphene oxide.

14. The insulating layer composition for a substrate according to claim 1, wherein the metal alkoxide compound and the graphene oxide are separately added into the insulating layer composition, or the metal alkoxide compound and the graphene oxide are added as a composite nano inorganic filler produced by a condensation reaction.

15. An insulating prepreg or an insulating film using the insulating layer composition for a substrate according to claim 1.

16. A substrate including the insulating prepreg or the insulating film according to claim 15.

17. The insulating layer composition for a substrate according to claim 2, $Ar_1$ includes one or more structural units selected from the group consisting of compounds expressed by Formula 2,

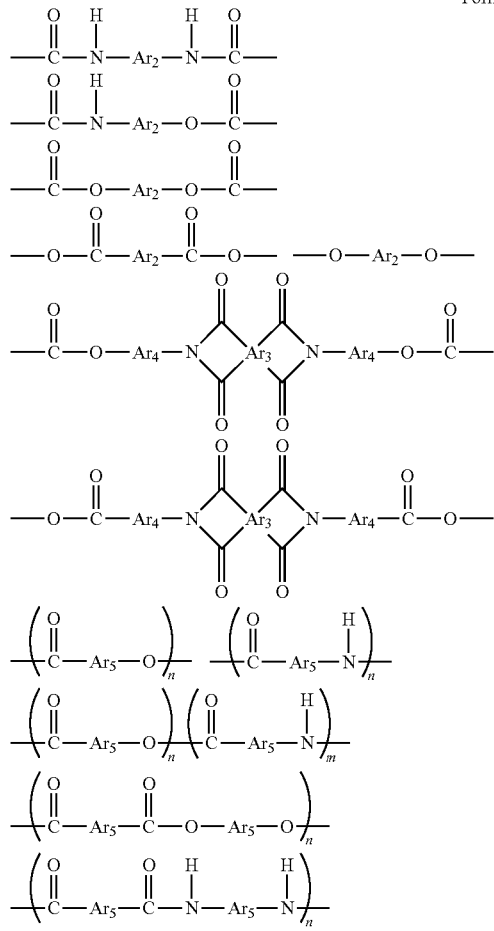

Formula 2

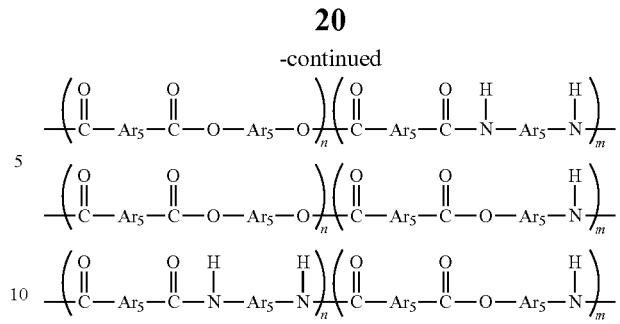

wherein, $Ar_2$, $Ar_4$, $Ar_5$ and $Ar_6$ each represent a bivalent aromatic organic group, which includes one or more structural units selected from the group consisting of compounds expressed by Formula 3, $Ar_3$ represents a tetravalent aromatic organic group, which includes one ore more structural units selected from the group consisting of compounds expressed by Formula 4, and n and m each represent an integer of 1 to 100, Formula 3

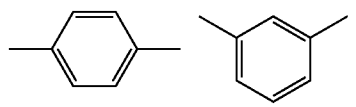
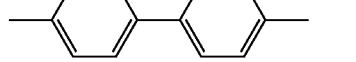
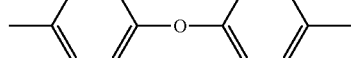
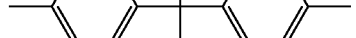
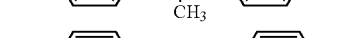

Formula 4

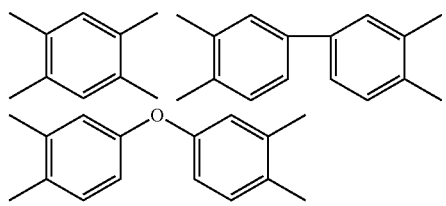

-continued
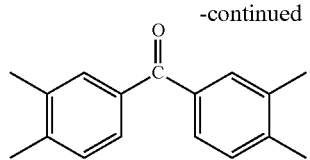
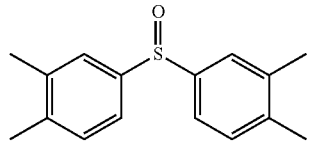
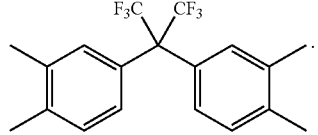
* * * * *

UNITED STATES PATENT AND TRADEMARK OFFICE
CERTIFICATE OF CORRECTION

PATENT NO. : 8,940,186 B2  
APPLICATION NO. : 13/657296  
DATED : January 27, 2015  
INVENTOR(S) : Soo Young Ji et al.

Page 1 of 2

It is certified that error appears in the above-identified patent and that said Letters Patent is hereby corrected as shown below:

In the Claims

Column 19, Lines 60-65, Claim 17, delete " 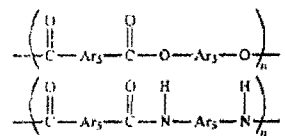 " and insert -- 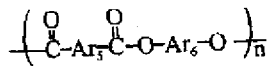 --, therefor.

Column 20, Lines 1-12, Claim 17, delete " 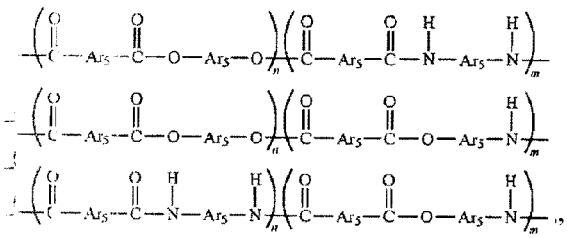 "

and insert -- 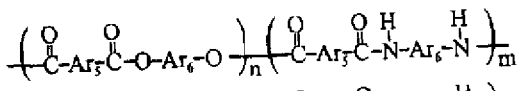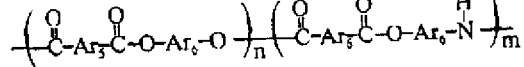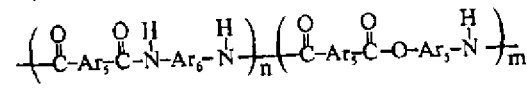 --, therefor.

Column 20, Line 20 (approx.), Claim 17, delete "ore" and insert --or--, therefor.

Signed and Sealed this  
Tenth Day of November, 2015

Michelle K. Lee  
*Director of the United States Patent and Trademark Office*

CERTIFICATE OF CORRECTION (continued)

U.S. Pat. No. 8,940,186 B2

Column 20, Lines 47-50 (approx.), Claim 17, delete " 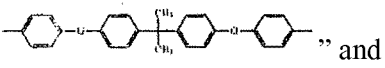 " and insert -- 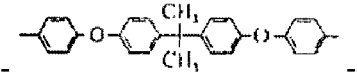 --, therefor.